(12) United States Patent
DeMone (10) Patent No.: US 6,967,523 B2
(45) Date of Patent: Nov. 22, 2005

(54) CASCADED CHARGE PUMP POWER SUPPLY WITH DIFFERENT GATE OXIDE THICKNESS TRANSISTORS

(75) Inventor: Paul W. DeMone, Kanata (CA)

(73) Assignee: Mosaid Technologies Incorporated, Kanata (CA)

( * ) Notice: Subject to any disclaimer, the term of this patent is extended or adjusted under 35 U.S.C. 154(b) by 0 days.

(21) Appl. No.: 09/966,391

(22) Filed: Sep. 28, 2001

(65) Prior Publication Data

US 2002/0101744 A1 Aug. 1, 2002

Related U.S. Application Data

(60) Provisional application No. 60/252,219, filed on Nov. 21, 2000.

(51) Int. Cl.[7] .................................................. G05F 1/10
(52) U.S. Cl. ......................... 327/537; 363/60; 307/110
(58) Field of Search ................................ 327/536, 537, 327/390, 394, 589; 363/59, 60, 61; 307/110, 35

(56) References Cited

U.S. PATENT DOCUMENTS

| | | | | |
|---|---|---|---|---|
| 4,839,787 A | * | 6/1989 | Kojima et al. .................. | 363/60 |
| 5,006,974 A | * | 4/1991 | Kazerounian et al. ......... | 363/60 |
| 5,126,590 A | | 6/1992 | Chern .......................... | 327/536 |
| 5,483,434 A | * | 1/1996 | Seesink ........................ | 363/60 |
| 5,625,544 A | * | 4/1997 | Kowshik et al. .............. | 363/59 |
| 5,721,509 A | | 2/1998 | Taft et al. .................... | 327/536 |
| 6,037,622 A | * | 3/2000 | Lin et al. ..................... | 257/299 |
| 6,097,161 A | * | 8/2000 | Takano et al. ............... | 315/291 |
| 6,373,328 B2 | * | 4/2002 | Rapp ........................... | 327/536 |
| 6,473,321 B2 | * | 10/2002 | Kishimoto et al. ........... | 363/59 |

FOREIGN PATENT DOCUMENTS

| | | |
|---|---|---|
| EP | 0 323 156 | 7/1989 |
| EP | 0 349 495 A | 1/1990 |
| EP | 0 466 532 A | 1/1992 |
| EP | 0 590 827 A | 4/1994 |
| EP | 0 851 561 | 7/1998 |
| EP | 0 902 525 A | 3/1999 |
| FR | 2 800 934 A | 5/2001 |
| WO | 00 38303 A | 6/2000 |

OTHER PUBLICATIONS

IEEE Journal of Solid–State Circuits, vol. 35, No. 5, May 2000, pp. 719–723.

(Continued)

*Primary Examiner*—Minh Nguyen
(74) *Attorney, Agent, or Firm*—Max R. Wood; Ogilvy Renault LLP (57) ABSTRACT

A cascaded charge pump based power supply for use with low voltage dynamic random access memory (DRAM) includes a charge pump and a non-overlapping clock signal generator. The charge pump circuit has two pump cascades coupled in parallel. Each pump cascade includes a plurality of pump stages connected serially between a power supply voltage and an output supply node. Adjacent stages of each cascade are clocked on opposite phases of the system clock signal. The charge pump drives an output supply node on both the rising and falling edge of the system clock signal. A non-overlapping clock signal generator for use with a charge pump has a charge sharing transistor which equalizes the non-overlapping output clock signals through charge sharing during the non-overlap period between subsequent phases of the system clock. The charge pump and capacitors are implemented using p-channel devices and the first stage of each cascade is constructed using thin-oxide devices.

10 Claims, 11 Drawing Sheets

OTHER PUBLICATIONS

Witters, Johan S. et al., "Analysis and Modeling of On–Chip High–Voltage Generator Circuits for Use in EEPROM Circuits", IEEE Journal of Solid–State Circuits, US, IEEE Inc., New York, vol. 24, No. 5, Oct. 1989, pp. 1372–1380.

"Efficient Method of Generating Two Phase Non–overlapping Clocks" IBM Technical Disclosure Bulletin, IBM Corp. New York, U.S., vol. 37, No. 4B, Apr. 1, 1994, pp. 381–383, XP000451288, ISSN: 0018–8689.

* cited by examiner

PRIOR ART

*FIG. 2B*

PRIOR ART

CASCADED CHARGE PUMP POWER SUPPLY WITH DIFFERENT GATE OXIDE THICKNESS TRANSISTORS

This application claims priority to U.S. Provisional Patent Application SC/Serial No. 60/252,219, filed Nov. 21, 2000, entitled "Charge Pump Based Power Supply for Low Voltage DRAM."

FIELD OF THE INVENTION

The invention relates generally to charge pumps used for increasing a supply voltage to obtain a higher voltage. More specifically, the invention relates to a charge pump based power supply for use with low voltage dynamic random access memory (DRAM).

BACKGROUND

Voltage multipliers are commonly used to increase the voltage of a supply source in order to provide the higher voltages needed to operate circuit elements. One type of voltage multiplier is called a charge pump and is commonly used in memory systems to provide the voltages needed for accessing, programming or erasing memory cells.

Figure 1:
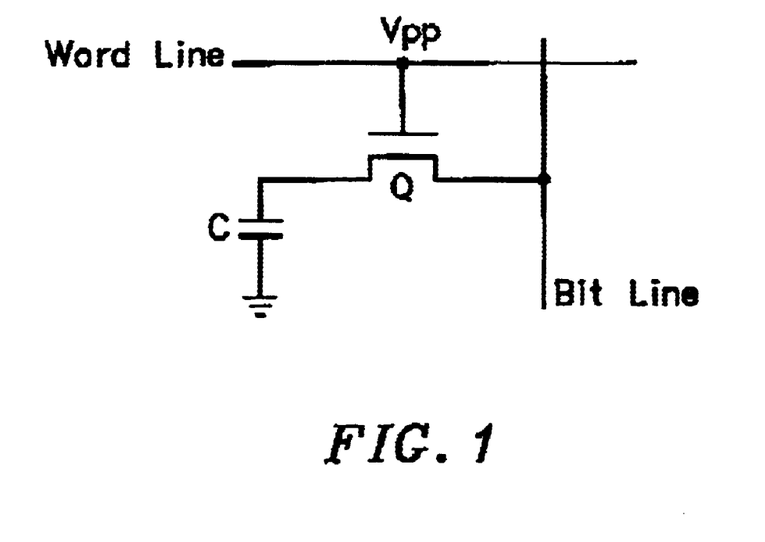
FIG. 1 is a schematic diagram of a typical DRAM cell.

For example, in the field of dynamic random access memory (DRAM) a charge pump circuit is typically used to generate a voltage which is used to enable a memory cell access transistor. A DRAM cell typically consists of a cell storage capacitor that stores a data bit as a voltage level and an n-channel field effect transistor (NFET) as an access transistor. A typical DRAM cell is depicted in FIG. 1. The memory cell is written by driving a potential of either 0 volts or Vdd volts onto the cell capacitor C through the access transistor Q. Vdd is the primary externally-provided power supply voltage, which is typically 2.5 or 3.3 volts. In order to fully and quickly drive the voltage across the cell capacitor C to Vdd when writing a high voltage to the cell, it is necessary to raise the potential on the gate of the access transistor Q to a value Vpp that is several volts above Vdd. This potential Vpp, which is higher than the externally-supplied power supply voltage Vdd, is typically provided by a charge pump circuit. Vpp must be several volts above Vdd in order to overcome the body-effect enhanced threshold voltage of the access transistor Q.

Figure 2A:
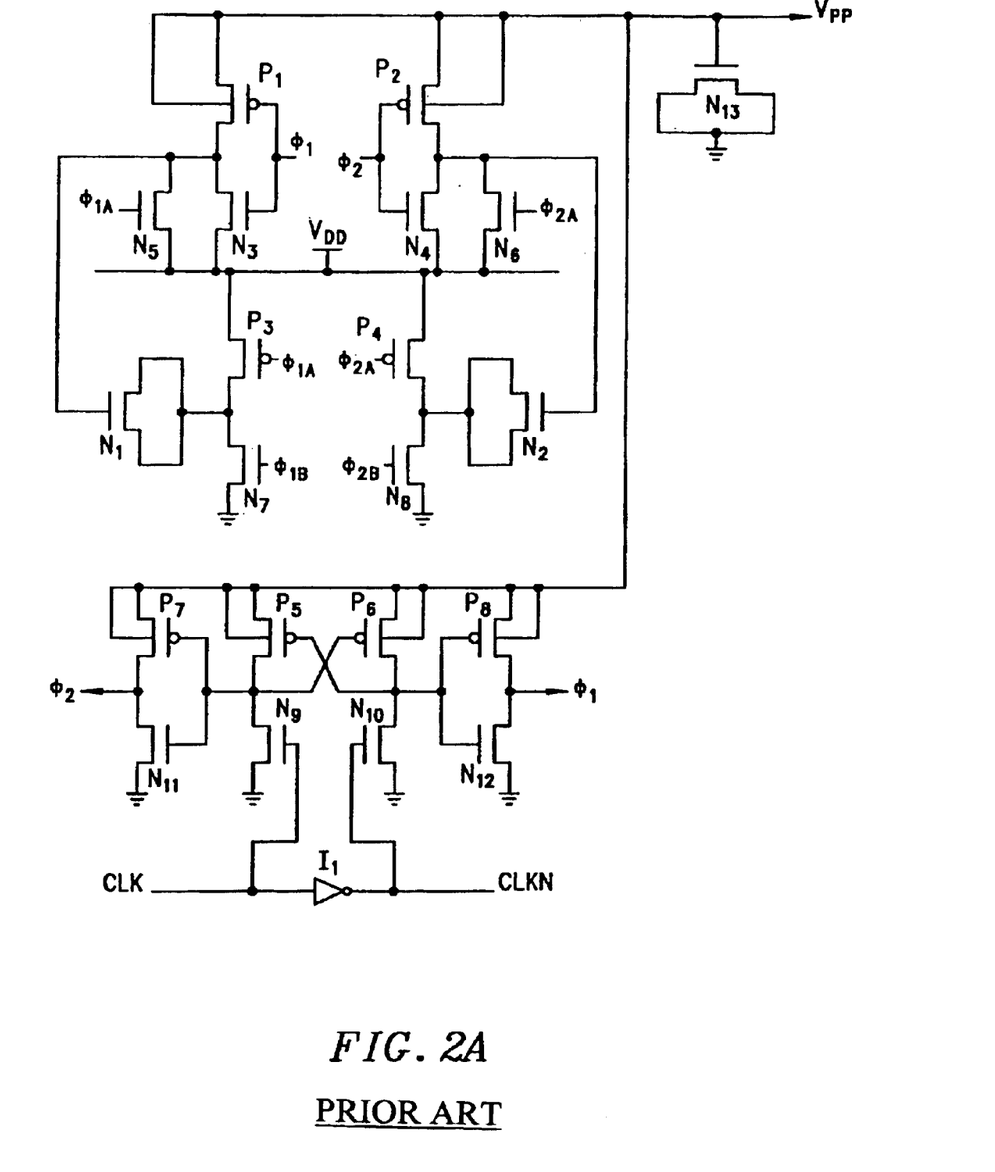
FIG. 2A is a schematic diagram of a single-stage, two-phase charge pump.
Figure 2B:
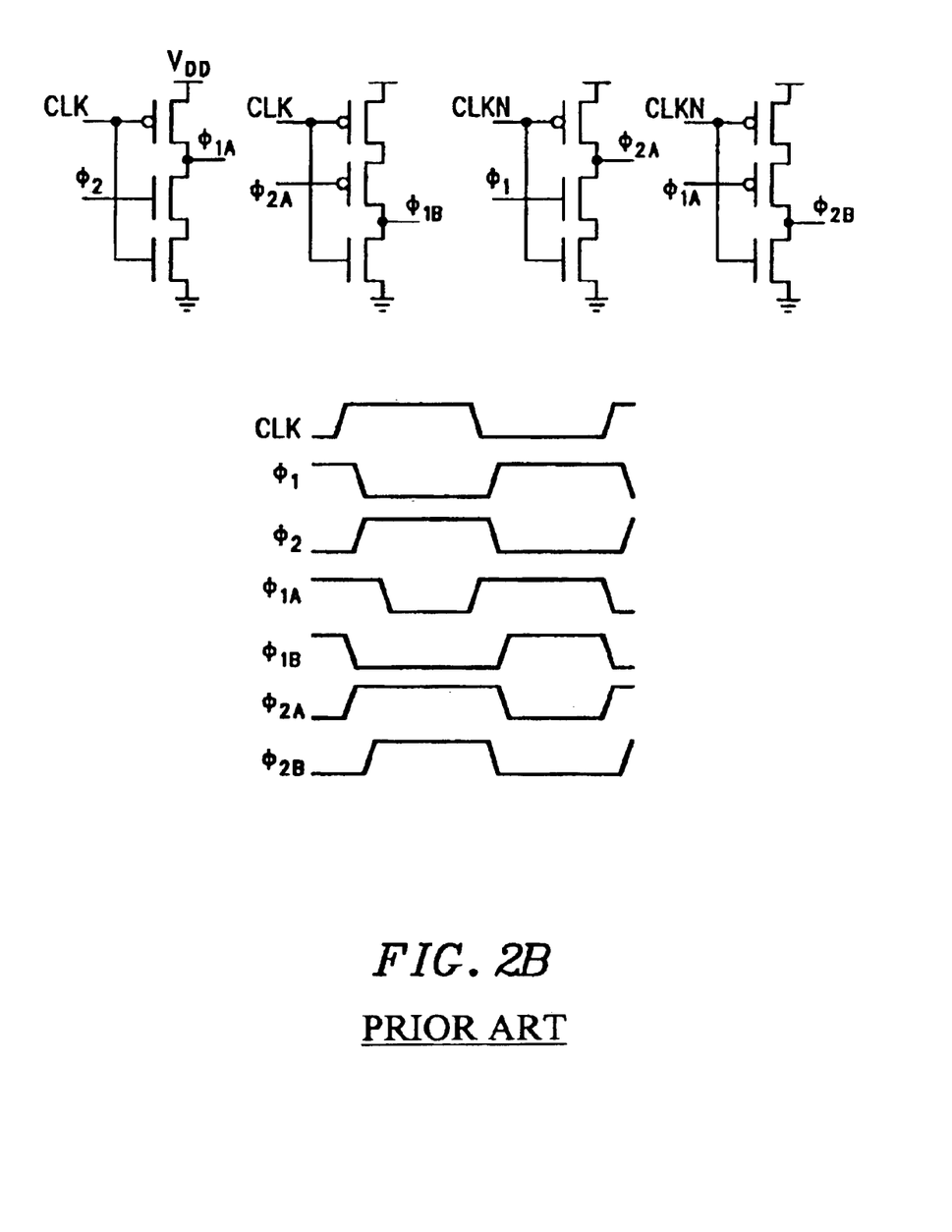
FIG. 2B is a schematic diagram of inverting stages and a timing diagram for the charge pump circuit of FIG. 2A.

For a variety of reasons, it is desirable to generate the Vpp potential internally to the DRAM device rather than providing it to the DRAM from an external power supply unit. The traditional means of generating Vpp within a DRAM is through the use of a single-stage, two-phase charge pump power supply circuit, which can generate potentials as high as twice Vdd. For example, for a Vdd of 2.5 volts, a potential of approximately 5.0 volts can be generated, although the steady-state Vpp value is usually regulated to a level around 3.5 V to 4.0 V through an associated regulator circuit. A typical single-stage, two-phase charge pump is shown in FIG. 2A. FIG. 2B illustrates four inverting stages and the corresponding clocks signals which are used to drive the charge pump circuit shown in FIG. 2A.

Semiconductor fabrication processes have advanced to include smaller transistor feature sizes and shorter transistor gate lengths. As such, the externally-supplied power supply voltage Vdd has been lowered proportionately to avoid damage to standard logic transistors. This reduction in Vdd has not been accompanied by a similar reduction in DRAM access transistor threshold voltage. As a result, the traditional single-stage, two-phase charge pump can no longer provide the necessary Vpp level needed for robust DRAM operation.

The requirement for voltages of more than twice Vdd has been previously faced in the field of non-volatile memory, specifically with devices such as flash EEPROM. A commonly used high voltage supply circuit for such applications is a four-stage, four-phase charge pump employing boosted gate transistors, as shown in FIG. 3A.

Figure 3A:
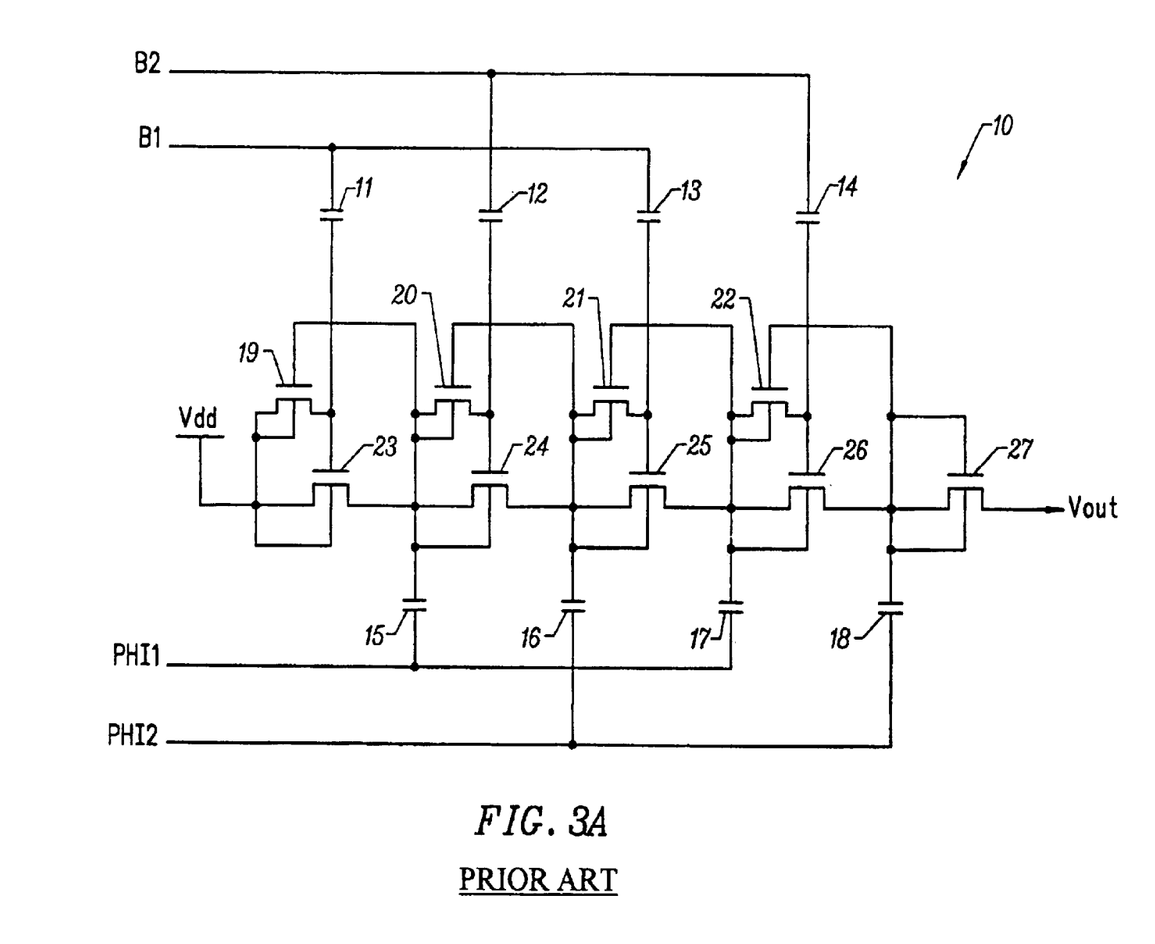
FIG. 3A is a schematic diagram of a four-stage, four-phase charge pump circuit.

FIG. 3A is a schematic diagram of a prior art four-stage, four-phase bootstrap charge pump circuit 10. Charge pump circuit 10 includes four-stages consisting of n-type field effect transistors (NFETs) and capacitors. The first stage includes NFET transistors 23 and 19 and capacitors 11 and 15, the second stage includes NFET transistors 24 and 20 and capacitors 12 and 16, the third stage includes NFET transistors 25 and 21 and capacitors 13 and 17, and the fourth stage includes NFET transistors 26 and 22 and capacitors 14 and 18, respectively. The four stages are connected in series between an input supply voltage Vdd and an output terminal Vout. Clock signal PHI1 is provided to capacitors 15 and 17 while clock signal PHI2 is provided to capacitors 16 and 18. Furthermore, boosting clock signals B1 and B2 are provided to capacitors 11, 13 and 12, 14, respectively.

Figure 3B:
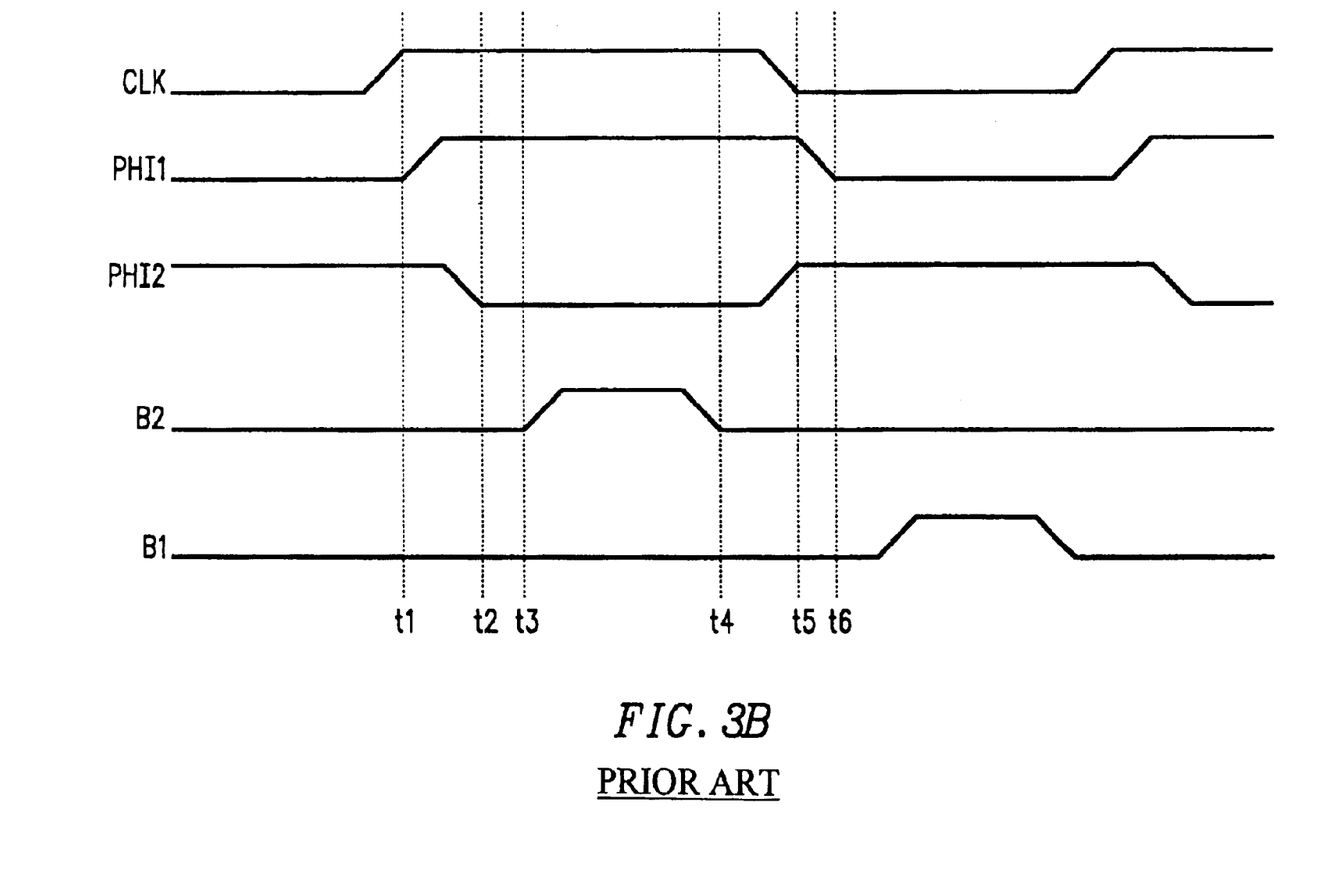
FIG. 3B is a timing diagram for the charge pump circuit of FIG. 3A.

FIG. 3B illustrates the relative timing of the clock signals PHI1, PHI2, B1 and B2, which are used to drive the pump circuit of FIG. 3A. Clock signals PHI1 and PHI2 are driven by opposite phases of a system clock signal CLK. It should be noted that the relative timing of these clock signals must be carefully overlapped in order to provide the appropriate operation of the charge pump as will be described below.

The operation of charge pump circuit 10 will now be discussed with reference to FIG. 3A and FIG. 3B and specifically with reference to the second pump stage. It is initially assumed that at some time prior to the timing intervals shown in FIG. 3B, boosting clock signal B1 was high and, as a result of the boosting action of capacitor 11, pass transistor 23 was turned on fully, thereby passing a voltage Vdd at the output of the first stage, i.e. the upper plate of capacitor 15. The initial conditions shown in FIG. 3B begin with clock signal PHI2 being at a high level while clock signals PHI1, B1 and B2 are at a low level. Since PHI2 is high, transistor 20 is turned on fully due to the boosting action of capacitor 16, and since transistor 20 is on turned on fully, transistor 24 exhibits the same voltage at its gate and drain, i.e. the voltage Vdd stored on capacitor 15. At time t1, clock signal PHI1 goes high, boosting the upper plate of capacitor 15 to a voltage level equal to 2 Vdd. Since PHI2 is still high at time t1, transistor 20 is still turned on and, as a result, transistor 20 passes the boosted gate voltage of 2 Vdd on to capacitor 12 at the gate terminal of transistor 24. When PHI2 then goes low at time t2, transistor 20 is turned off, isolating the gate of transistor 24 and leaving capacitor 12 charged to a voltage level equal to 2 Vdd. At time t3, boosting clock signal B2 goes high causing the voltage at the gate terminal of transistor 24 to be boosted to a voltage level equal to 3 Vdd, thereby fully turning on transistor 24. Transistor 24 thus passes the full voltage of 2 Vdd which is stored on capacitor 15 on to the next stage, i.e. the upper plate of capacitor 16, without any threshold drop across transistor 24. At time t4, boosting clock signal B2 goes low and transistor 24 begins to turn off, which isolates the boosted node on capacitor 16. Subsequently, at time t5, PHI2 rises, turning on transistor 20 and thereby discharging the gate terminal of transistor 24 to the voltage level at the drain terminal of transistor 24. At time t6, when PHI1 goes low, transistor 24 remains off while transistor 20 remains on.

The operation of charge pump circuit 10 has been discussed with emphasis on the second stage of the charge pump and will now be discussed with respect to the entire charge pump. The following sequence occurs within each pump stage: the bootstrapping transistor of a particular stage (transistor 19 in stage 1, transistor 20 in stage 2, transistor 21 in stage 3, and transistor 22 in stage 4) is turned on fully. The bootstrapping transistor thus precharges the gate terminal of the pass transistor for that particular stage (transistor 23 for stage 1, transistor 24 for stage 2, transistor 25 for stage 3, and transistor 27 for stage 4) to a voltage equal to the pass transistor's drain voltage. Subsequently, the bootstrap transistor (19, 20, 21, or 22) is turned off and the gate terminal of the pass transistor (23, 24, 25 or 26) is isolated and remains charged. Shortly thereafter, a boosting clock signal (B1 or B2) is delivered through a boosting capacitor (11, 12, 13 or 14) to the gate terminal of the pass transistor (23, 24, 25 or 26), thereby boosting the gate and allowing the pass transistor to pass the full voltage at its drain with no threshold voltage drop. Finally, the main pumping clock signal for that particular stage (PHI1 for stages 1 and 3, and PHI2 for stages 2 and 4) boosts the source voltage on the pass transistor (23, 24, 25 or 26), thereby increasing the output of that stage by an additional voltage level Vdd and providing this increased voltage to the next stage. It should be noted that due to the main pumping clock signals PHI1 and PHI2, stages 1 and 3 of the charge pump operate in tandem, and stages 2 and 4 operate in tandem, but stages 1 and 3 operate on the opposite phase compared to stages 2 and 4. This process continues until sufficient voltage is generated on the output Vout, as detected by a level detector within a regulator (not shown in FIG. 3A). Typically, when the appropriate level has been reached, the clock signals used to drive the pump will be disabled until the level detector detects a drop in Vout which is below a predetermined level. At this point, the clock signals will once again be activated.

The third and fourth stages of charge pump circuit 10 therefore operate in the same manner as the first and second stages. The second stage passes onto the third stage a voltage equal to three times the input supply voltage Vdd, and the third stage passes on to the fourth stage a voltage equal to four times the input supply voltage Vdd. The fourth stage drives output transistor 27, which is configured to finction as a diode. Output transistor 27 is in a conductive state only when clock signal PHI2 goes high, which corresponds to the falling edge of input clock signal CLK. Therefore, the output terminal Vout is driven only on the falling edge of input clock signal CLK. The output terminal provides a voltage Vout that equals four times the input supply voltage Vdd.

The four-stage, four-phasc charge pump design shown in FIG. 3A has several drawbacks that make it unsuitable for use as a Vpp supply circuit for low voltage DRAM applications. Four pump stages are not required to generate Ithe necessary voltage level for Vpp in a DRAM application. The four-stage, fourphase charge pump also contributes to a larger circuit size and greater energy loss at the higher peak and average current levels required by a DRAM. Further, the use of boosted gate transistors could hinder the ability of the power supply to adapt to rapid increases in Vpp current demand under certain circumstances, such as when a DRAM exits a power down state. In addition, the four individual clock phases required to drive the charge pump shown in FIG. 3A need to be very precisely generated, ensuring the appropriate overlap times required to accomplish the boosting operations. If the clock timings are not accurately implemented, charge leakage from an up-stream stage may occur to a down-stream phase, thereby significantly reducing the efficiency of the charge pump.

Figure 4A:
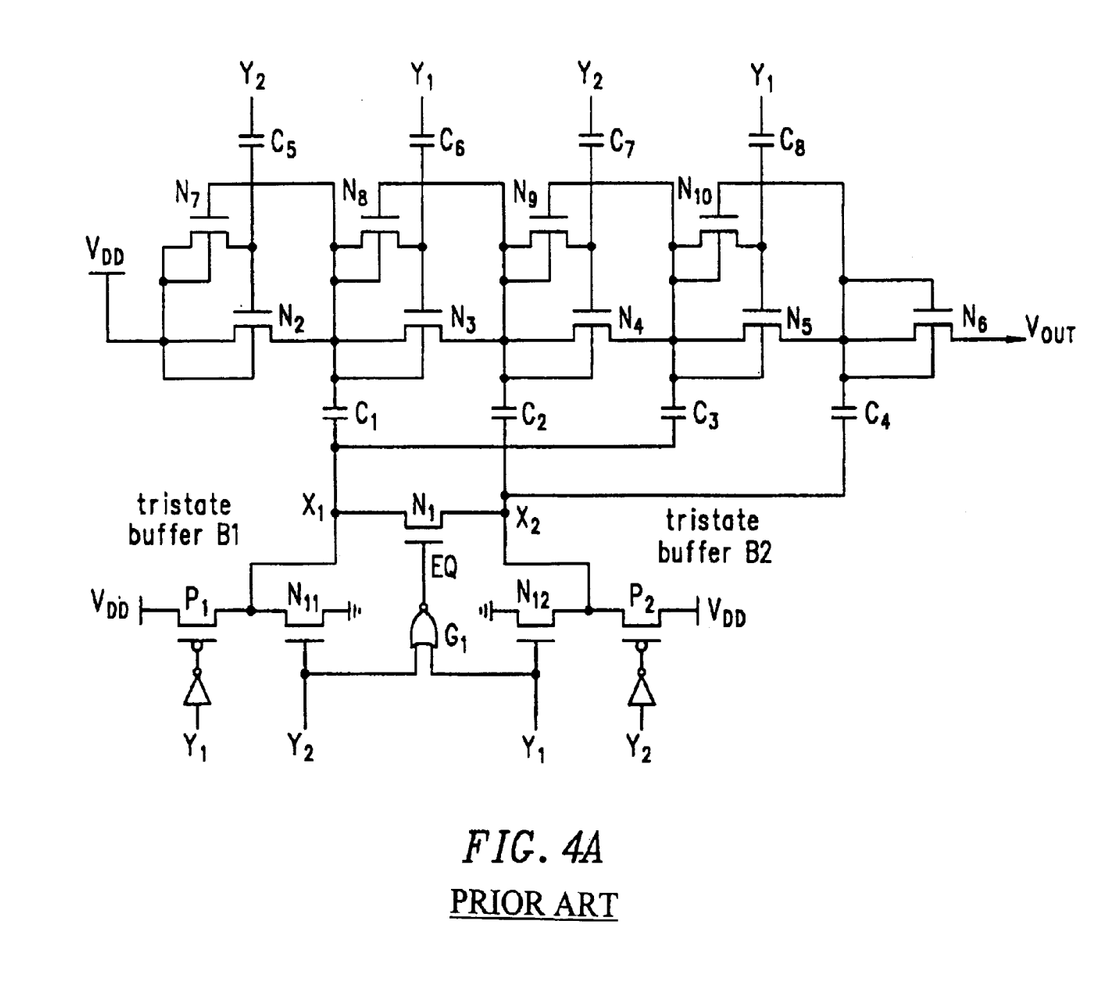
FIG. 4A is a schematic diagram of an enhanced four-stage, fourphase charge pump circuit.
Figure 4B:
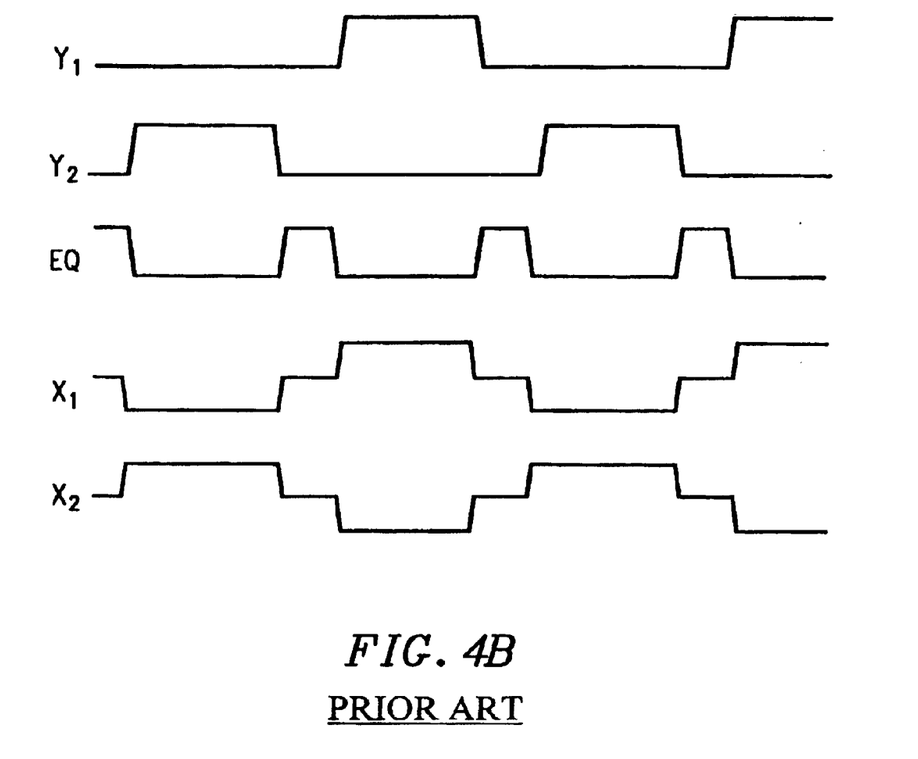
FIG. 4B is a timing diagram for the charge pump circuit of FIG. 4A.

An enhancement of the four-stage four-phase charge pump is shown in FIG. 4A. In this approach, an n-channel FET N1 is used to equalize the charge pump clock inputs X1 and X2. This allows charge sharing to occur during the non-overlap period between clock phases as shown in FIG. 4B. By equalizing the clock inputs in this fashion, the amount of power used by the tristate buffers B1 and B2 (comprised of transistors P1, N11 and P2, N12, respectively) which generate the clock signals is reduced, thereby increasing the conversion efficiency of the charge pump circuit. It should be noted that in the implementation described with reference to FIG. 4A and FIG. 4B, clock signals X1 and X2, which are equalized by transistor N1 during the non-overlapping period, are also driven by tri-state buffers B1 and B2. As a result there is a potential overlap in the operation of equalization transistor N1 and the tri-state buffer transistors P1, N11 and P2, N12. Forexample, considering the initial conditions shown in FIG. 4B, signal Y1 is logic low, signal Y2 is logic high and as a result, transistor P2 of buffer B2 is on and transistor N11 of buffer B1 is on, resulting in signal X1 being logic low and signal X2 being logic high. When Y2 begins to transition from logic high to logic low, transistor N11 will begin to turn off, NOR gate G1, which generates the EQ pulse, will begin to turn on and the inverter driving transistor P2 will begin to switch its output from logic low to logic high. As a result, depending on the propagation delays of NOR gate G1 and the inverter driving transistor P2, the EQ pulse may turn on transistor N1 slightly before transistor P2 is turned off. Ideally, in order to avoid charge loss and reduction in the power efficiency of the pump, charge-sharing between clock signals X1 and X2 should occur when both buffers B1 and B2 are in an inactive state.

SUMMARY

In order to overcome the deficiencies discussed above, an embodiment of the invention relates to a charge pump circuit. In an embodiment, the charge pump circuit comprises two pump cascades coupled in parallel. Each pump cascade includes a plurality of pump stages connected serially between an input supply voltage Vdd and an output node. The corresponding pump stages of each pump cascade are clocked on opposite phases of an input clock signal. Further, adjacent stages of each cascade are clocked on opposite phases of the input clock signal. The first stage of each pump cascade in some embodiments utilizes thin oxide transistors. The charge pump drives an output node on both the rising and falling edge of the input clock signal.

A charge pump in accordance with one embodiment of the present invention ensures a steady flow of current and reduces the ripple of the output voltage. The charge pump can be operated using a smaller output reservoir capacitance or a higher output current than an equivalently sized single cascade charge pump which pumps only on the rising edge of an input clock signal, while providing the same degree of output voltage regulation. The use of thin oxide transistors in the first stage of each cascade reduces the overall size of the charge pump.

Another embodiment of the invention is directed towards a non-overlapping clock signal generator. In an embodiment, the non-overlapping clock signal generator comprises two transistor pairs that forn tri-state inverters for driving two output clock signals. The non-overlapping clock signal generator further comprises a charge sharing transistor which equalizes the output clock signals through charge sharing during the non-overlap period between clock phases.

The result of this connection is a reduction of power consumption by the tri-state inverters formed by the transistor pairs. The charge sharing transistor is controlled by an equalization pulse, which is the output of a logic gate. This ensures that the operation of the charge sharing transistor is completely non-overlapping with the active operation of any of the four drive transistors and thus minimizes charge loss and maximizes power efficiency.

An embodiment of the non-overlapping clock signal generator further comprises a transmission gate included to introduce a propagation delay. Inclusion of the transmission gate preserves the duty cycle of the input clock signal CLK in the respective high and low periods of the two output clock signals, as well as the duration of the non-overlap period between when a first output clock signal goes low and when a second output clock signal goes high, and the non-overlap period between when a first output clock signal goes high and when a second output clock signal goes low. Equalization of the non-overlap period when the drive transistors are all disabled is important to maximize the efficiency of the charge sharing transistor.

BRIEF DESCRIPTION OF THE DRAWINGS

The present invention is described with respect to particular exemplary embodiments thereof and reference is accordingly made to the drawings in which.

DETAILED DESCRIPTION

Figure 5A:
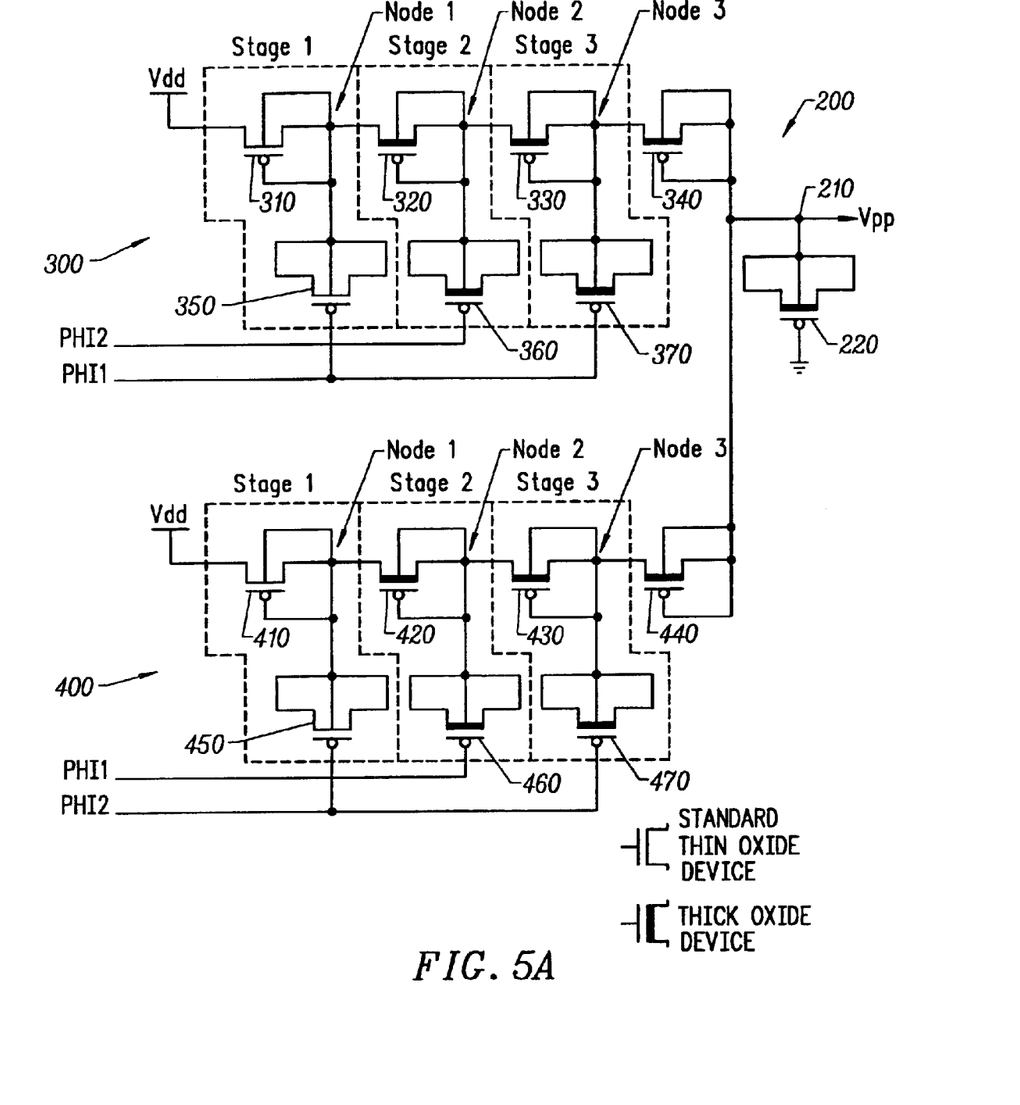
FIG. 5A is a schematic diagram of a charge pump circuit in accordance with an embodiment of the invention.

FIG. 5A is a schematic diagram of a charge pump circuit 200 in accordance with one embodiment of the invention. Charge pump circuit 200 includes two pump cascades 300 and 400 connected in parallel to an output node 210. Each pump cascade includes three pump stages connected serially between input supply voltage Vdd and the output node 210. Note that although only three pump stages are shown in FIG. 5A, a greater number of pump stages may be used pin other embodiments.

Figure 5B:
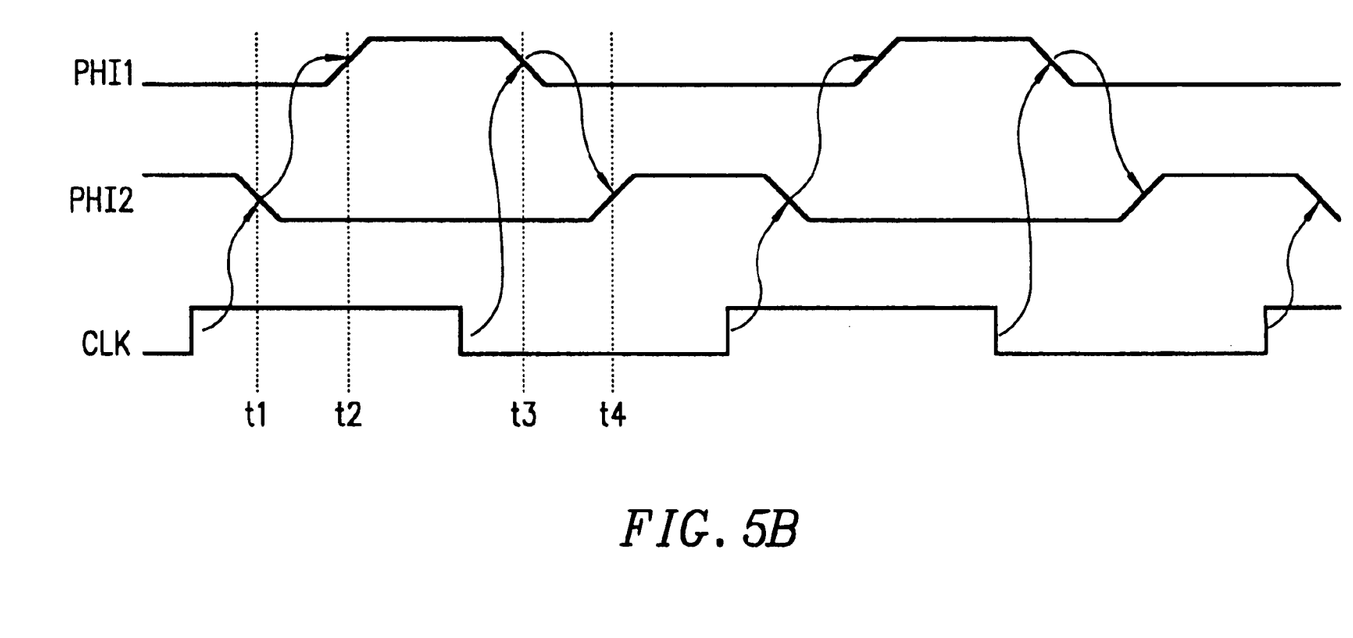
FIG. 5B is a timing diagram for the charge pump circuit of FIG. 5A.

The inputs to pump cascades 300 and 400 are input supply voltage Vdd and driving clock signals PHI1 and PHI2. Input supply voltage Vdd provides the supply of charge for the charge pump. As shown in FIG. 5B, non-overlapping driving clock signals PHI1 and PHI2 are driven by opposite phases of input clock signal CLK.

The corresponding pump stages of each pump cascade of charge pump circuit 200 are clocked on opposite phases of an input clock signal. Further, adjacent stages of each pump cascade are clocked on opposite phases. As a result, the two pump cascades 300 and 400 operate in an interleaved manner, with each respective stage in each cascade receiving a driving clock signal which is of opposite phase to the driving clock signal delivered to the corresponding stage in the other cascade. With reference to pump cascade 300, transistor 350 of Stage 1 and transistor 370 of Stage 3 are connected to PHI1, and transistor 360 of Stage 2 is connected to PHI2. Likewise, for pump cascade 400, transistor 450 of Stage 1 and transistor 470 of Stage 3 are connected to PHI2, and transistor 460 of Stage 2 is connected to PHI1.

Each pump stage of charge pump circuit 200 comprises a p-type field effect transistor (PFET) configured to function as a capacitor and a PFET configured to function as a diode. The PFETs configured as capacitors can be replaced with n-type field effect transistors (NFETs), while the PFETs configured as diodes can be replaced with NFETS, diodes or bipolar transistors in various embodiments of the invention.

As shown in FIG. 5A, Stage 1 of pump cascade 300 includes transistor 310 connected in a diode configuration. The source terminal of transistor 310 is connected to power supply voltage Vdd, and the drain terminal of transistor 310 represents the output of Stage 1 and is connected to the source terminal of the next stage's transistor (transistor 320). The drain terminal of transistor 310 is also connected to the gate terminal and the substrate of transistor 310. Stage 1 further comprises transistor 350 configured to function as a capacitor. The drain and source terminals and the substrate of transistor 350 are coupled to the drain terminal of transistor 310. The gate terminal of transistor 350 receives driving clock signal PHI1.

The remaining stages of pump cascades 300 and 400 are configured similarly to Stage 1 of pump cascade 300, the differences being the respective phase connections and the fact that Stage 2 and Stage 3 are connected to the drain terminal of the transistor of the previous stage instead of being connected to Vdd.

Pump cascades 300 and 400 further include an output stage device consisting of transistor 340 and transistor 440, respectively. Transistors 340 and 440 are each configured to function as a diode, and supply pumped output voltage Vpp at output node 210. Output node 210 is coupled to output capacitance device 220.

In addition, as shown by the transistor symbols used in FIG. 5A, Stage 1 of both pump cascades is comprised of thin oxide transistors. The remaining transistors of the charge pump 200 are comprised of thick oxide transistors. The use of thin oxide transistors in the first stage of each cascade reduces the overall size of charge pump 200, and takes advantage of the higher transconductance and gate capacitance per unit area of thin oxide devices while obtaining similar performance as the larger thick oxide devices in the second and third stages.

The operation of charge pump circuit 200 will now be discussed. Charge pump circuit 200 operates as follows for any two adjacent stages receiving opposite phased driving clock signals. With reference to FIG. 5B, at time t1, Stages 1 and 3 of pump cascade 400 and Stage 2 of pump cascade 300 receive a logic low level from clock signal PHI2 as it transitions from a logic high level. This logic low level of PHI2 at time t1 is capacitively coupled to the output node of each stage, which begins to turn on the diode transistor of that stage (transistor 410 and 430 for stages 1 and 3 of pump cascade 400, and transistor 320 for stage 2 of pump cascade 300.) Thus, the output node of each stage is precharged to the voltage present at the source of the diode transistor less a transistor threshold voltage (Vtp). For example, with reference to Stage 1 of pump cascade 400, Node 1 is precharged to a voltage level of Vdd−Vtp. At time t1, all stages receiving driving clock signal PHI2 will perform the same precharge operation for their respective output nodes, thereby precharging their output nodes to a voltage which is equivalent to the voltage of the source on their diode transistor less a transistor threshold voltage, i.e. Vsource−Vtp.

Again with reference to FIG. 5B, at time t2, Stages 1 and 3 of pump cascade 300 and Stage 2 of pump cascade 400 receive a logic high level from PHI1. This logic high level charges the capacitor transistor of each stage (capacitor 350, 370 or 460), which boosts the voltage on the output node of that respective stage. This boosted voltage is subsequently passed on to the next consecutive stage. For example, Stage 1 of pump cascade 300 (which, in the manner explained above, has previously precharged its output to a voltage Vdd−Vtp) has its output voltage boosted by the capacitively coupled voltage on Node 1, resulting in a boosted voltage at Node 1 of 2 Vdd−Vtp. This boosted voltage is then available as the input voltage Vsource for Stage 2 of pump cascade 300, which Stage 2 will use during its next precharge operation.

At time t3, Stages 1 and 3 of pump cascade 300 and Stage 2 of pump cascade 400 receive a logic low level from clock signal PHI1. These stages thus perform the precharging operation of their respective output nodes, as described above. At time t4, Stages 1 and 3 of pump cascade 400 and Stage 2 of pump cascade 300 receive a logic high level from clock signal PHI2. As such, these stages perform the boosting operation of their respective output nodes, as explained above.

Charge pump 200 continues to operate in the interleaved manner explained, with the pump stages receiving a logic low level operating to precharge their respective output nodes to a voltage level Vsource−Vtp, and the pump stages receiving a logic high level operating to boost their respective output nodes to a voltage level of Vsource+Vdd−Vtp. The charge pump continues to push charge toward the output node until an appropriate voltage level is reached, which is usually determined by a level detector (not shown in FIG. 5A). Each pump cascade furnishes at output node 210 a voltage Vpp, which is approximately three times the input supply voltage Vdd, less the threshold voltage drop of the three diode transistors (transistors 310–340 of pump cascade 300 and transistors 410–440 of pump cascade 400). Charge pump 200 does not utilize boosted gate transistors, therefore the three diode transistors experience a threshold voltage drop. The use of boosted gate transistors could hinder the ability of the input power supply to adapt to rapid increases in Vpp current demand under certain circumstances, such as when a DRAM exits a power down state. Charge pump 200 can be modified to include more or fewer pump stages to provide different degrees of voltage multiplication.

Viewing charge pump circuit 200 as a whole, the use of two pump cascades clocked by signals derived from opposite phases of input signal CLK (signal PHI1 and signal PHI2) allows charge to be driven onto output node 210 on both the rising edge and falling edge of input clock CLK. Specifically, with reference to FIG. 5A, the rise of PHI1 turns on transistor 340, thereby driving output node 210. PEW rises on the rising edge of input clock signal CLK.

Likewise, the rise of PHI2 turns on transistor 440, thereby driving output node 210. PHI2 rises on the falling edge of input clock signal CLK.

Driving output node 210 on both the rising edge and falling edge of input clock signal CLK equalizes the load on signals PHI1 and PHI2. It also ensures a steady flow of current on output node 210 and reduces the ripple of output voltage Vpp. As such, charge pump circuit 200 can be operated using a smaller output reservoir capacitance 220 or a higher output current than an equivalently sized single cascade charge pump which pumps only on the rising edge of an input clock signal, while providing the same degree of output voltage regulation.

Figure 6A:
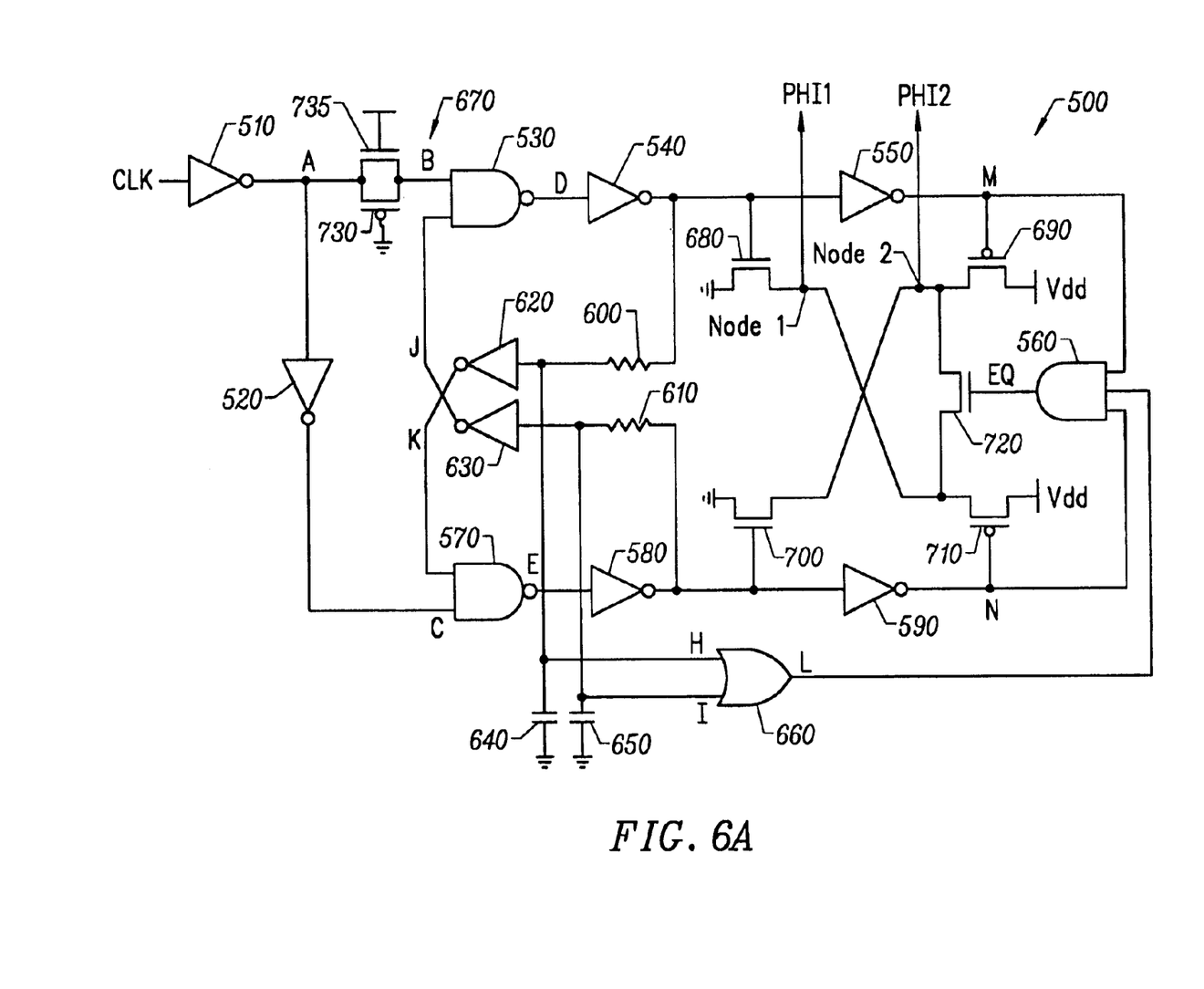
FIG. 6A is a schematic diagram of a non-overlapping clock signal generator in accordance with an embodiment of the invention.

FIG. 6A is a schematic diagram of non-overlapping clock signal generator 500. Non-overlapping clock signal generator 500 generates clock signals PHI1 and PHI2 which consist of opposite phases of input clock signal CLK. The clock signals PHI1 and PHI2 generated by non-overlapping clock signal generator 500 are suitable for use with a charge pump circuit, such as the circuit depicted in FIG. 5A. With such an embodiment, the clock signals PHI1 and PHI2 driving the charge pump would resemble the signals PHI1 and PHI2 depicted in FIG. 6B.

Non-overlapping clock signal generator 500 receives as inputs an input clock signal CLK through inverter 510 and an input supply voltage Vdd through PFET 690, PFET 710 and transmission gate 670. Transmission gate 670 comprises two transistors, NFET 735 and PFET 730, configured in the following manner. NFET 735 has its source terminal coupled to the drain terminal of PFET 730, and has its drain terminal coupled to the source terminal of PFET 730. The gate terminal of NFET 735 receives input supply voltage Vdd, while the gate terminal of PFET 730 is coupled to ground.

Non-overlapping clock signal generator 500 receives as inputs an input clock signal CLK from a system clock input node (not shown) through inverter 510 and an input supply voltage Vdd through PFET 690, PFET 710 and transmission gate 670. Transmission gate 670 comprises two transistors, NFET 735 and PFET 730, configured in the following manner. NFET 735 has its source terminal coupled to the drain terminal of PFET 730, and has its drain terminal coupled to the source terminal of PFET 730. The gate terminal of NFET 735 receives input supply voltage Vdd, while the gate terminal of PFET 730 is coupled to ground.

A clock input stage is formed by inverter 510 is coupled to transmission gate 670 and inverter 520. Transmission gate 670 provides an input to NAND gate 530, while inverter 520 provides an input to NAND gate 570. The output of NAND gate 530 is transmitted through inverter 540, resistor 600 and inverter 620 to one input terminal of NAND gate 570. NAND gate 570 is similarly configured, such that the output of NRND gate 570 is transmitted through inverter 580, resistor 610 and inverter 630 to one input terminal of NAND gate 530. The cross-coupled NAND gates form a latch coupled to the clock input stage. As such, the cross-coupled connection between NAND gates 530 and 570 ensures that the two clock sigal outputs PHI1 and PHI2 will be non-overlapping clock signals.

NFET 680 has its gate terminal coupled to the output of inverter 540, its source terminal coupled to ground, and its drain terminal coupled to the drain terminal of PFET 710. NFET 700 has its gate terminal coupled to the output of inverter 580, its source terminal coupled to ground, and its drain terminal coupled to the drain terminal of PFET 690, PFET 690 has its gate terminal coupled to the output of inverter 550, its source terminal coupled to input supply voltage Vdd, and its drain terminal coupled to the drain terminals of NFET 700 and NFET 720. PFET 710 has its gate terminal coupled to the output of inverter 590, its source terminal coupled to input supply voltage Vdd, and its drain terminal coupled to the drain terminal of NFET 680 and the source terminal of NFET 720. The gate terminal of NFET 720 receives the output of AND gate 560. Clock signals PHI1 and PHI2 are provided at Node 1 and Node 2.

A clock output driving stage is formed by a pair of NFETS 680, 700 and a pair of PFETS 690, 710. The NFFT 680 has its gate terminal coupled to the output of inverter 540, its source terminal coupled to ground, and its drain terminal coupled to the drain terminal of PFET 710. NFET 700 has its gate terminal coupled to the output of inverter 580, its source terminal coupled to ground, and its drain terminal coupled to the drain terminal of PFET 690. PFET 690 has its gate terminal coupled to the output of inverter 550, its source terminal coupled to input supply voltage Vdd, and its drain terminal coupled to the dain terminals of NFET 700 and NFET 720. PFET 710 has its gate terminal coupled to the output of inverter 590, its source terminal coupled to input supply voltage Vdd, and its drain terminal coupled to the drain terminal of NFET 680 and the source terminal of NFET 720. The gate terminal of NFET 720 receives the output of AND gate 560. Clock signals PHI1 and PHI2 are provided at Node 1 and Node 2.

Figure 6B:
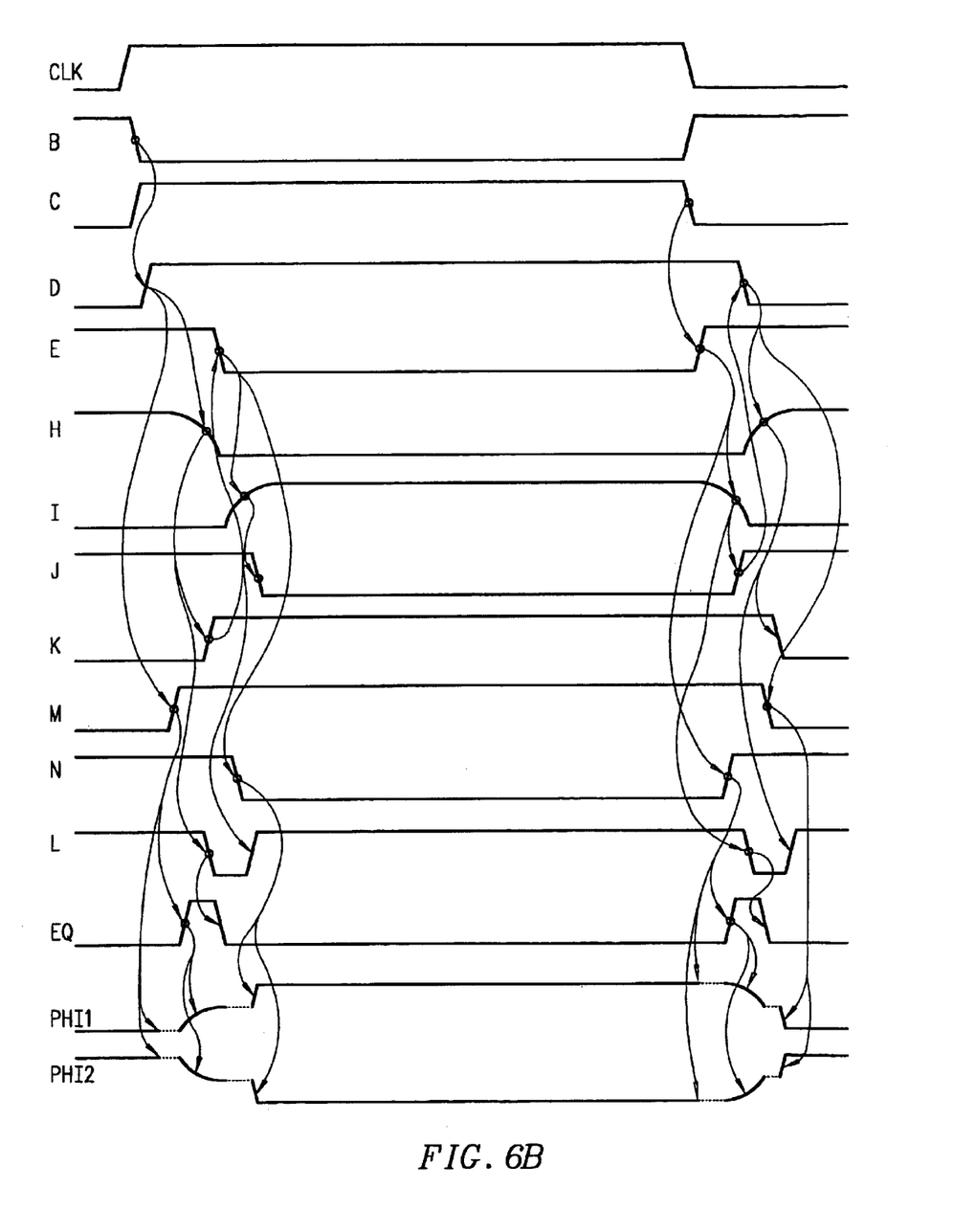
FIG. 6B is a timing diagram for the non-overlapping clock signal generator of FIG. 6A.

FIG. 6B is a timing diagram depicting the waveforms generated at various nodes of the non-overlapping clock signal generator 500 during operation. As can be seen from FIG. 6A, node A (not shown in FIG. 6B) represents the output of inverter 510. Nodes B and C represent one input of the two-input NAND gates 530 and 570, respectively. Nodes D and E represent the outputs of NAND gates 530 and 570, respectively and are complementary signals which when passed though their respective inverters 540 and 580, may be termed complementary latch outputs. Nodes H and I may be termed intermediate latch outputs and represent the inputs of OR gate 660. Nodes J and K represent the second input of the two-input NAND gates 530 and 570, respectively. Node L represents the output of OR gate 660, while nodes M and N drive the gate terminals of transistors 690 and 710, respectively. FIG. 6B also depicts the system clock CLK, the equalization pulse EQ, and the generated clock signals PHI1 and PHI2.

To further achieve maximum charge pump efficiency, the circuitry that generates the PHI1 and PHJ2 clock signals is designed to preserve the duty cycle of the input clock signal CLK in the respective high and low periods of PHI1 and PHI2, as well as the duration of the non-overlap period between when PHI2 goes low and when PHI1 goes high and the non-overlap period between when PHI2 goes high and when PHI1 goes low. This is achieved by inserting an appropriately sized transmission gate 670 between inverter 510 and NAND gate 530 to add a propagation delay equivalent to the delay induced by inverter 520. The inclusion of transmission gate 670 equalizes the delay from output of inverter 520 to the input of NAND gate 530 and the delay from the output of inverter 520 to the input of NAND gate 570. Equalization of the non-overlap period when the drive transistors are all disabled is important to maximize the efficiency of charge sharing transistor 720.

The specifics of the operation of non-overlapping signal generator 500 will now be discussed. Beginning with a rising edge of system clock signal CLK, node A (not shown in FIG. 6B) falls to a logic low and node C rises to logic high via inverter 520. The signal on node A passes through transmission gate 670 and then causes node B to also fall to logic low. The purpose of transmission gate 670 is to introduce a delay equivalent to the delay of inverter 520, thereby ensuring that signals on nodes B and C arrive at their respective NAND gates 530 and 570 simultaneously. The insertion of transmission gate 670 will ensure that the duty cycle of the system clock signal CLK is preserved in the respective high and low segments of output clock signals PHI1 and PHI2. As a result of node B falling to logic low while node J remains at logic high, the output of NAND gate 530, i.e. node D, rises to logic high. Meanwhile, since node K begins at logic low, the rising edge on node C has no effect on the output of NAND gate 570, i.e. node E, which remains logic high. The rising edge of node D causes node M to rise after a two-inverter delay through inverters 540 and 550. Furthermore, the rising edge of node M, in combination with a logic high on node N and a logic high on node L, causes equalization AND gate 560 to generate a rising edge on the equalization pulse EQ. It should be noted that at this time, i.e. when EQ turns on transistor 720, none of the driving transistors 680, 690, 700 and 710 are on since both nodes M and N are logic high. The rising edge of node D also causes node H at the input of inverter 620 to begin to fall to logic low. The signal from node D is delayed through inverter 540 and resistor 600 and capacitor 640, causing node H to fall at a slower rate, as shown in FIG. 6B. OR gate 660 has input nodes H and I, and since node I is initially low, once node H begins to fall, node L begins to fall. The falling edge on node L at the output of OR gate 660 causes AND gate 560 to generate a falling edge on the equalization pulsel EQ, thereby terminating the equalization pulse while both tri-state activating signals on nodes M and N remain high and maintain the tri-state buffers inactive. Once node H begins to fall to logic low, this falling edge transition is transmitted to node K via inverter 620. As a result, node K rises, and in combination with node C, switches the output of NAND gate 570, i.e. node E, to logic low. The falling edge of node E causes transistor 700 to turn on due to the inverting action of inverter 580 and also causes node N to fall to logic low after the two-inverter delay through inverter 580 and 590, thereby turning on transistor 710. As a result of the falling edge of node E and N, one of the non-overlapping clock outputs PHI1 is pulled to logic high via transistor 710, and the other non-overlapping clock output PHI2 is pulled to logic low via transistor 700.

A similar process takes place on the next falling edge of the system clock, shown by the transitions on the right side of FIG. 6B. It is important to note that the non-overlapping clock generator latch (comprising NAND gates 530, 570 and inverters 540, 620, 580 and 630) in conjunction with the RC delays introduced by resistors 660, 610 and capacitors 640 and 650 and in conjunction with the OR gate 660 and AND gate 560 provide overlap protection preventing the equalization of the two output non-overlapping clock signals during a time when either one of the tri-state buffer driving transistors are on.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. A charge pump power supply for a DRAM, comprising a charge pump circuit comprising a first and a second pump cascade coupled in parallel to an output node, each pump cascade having a plurality of pump stages coupled in series, the output node receiving charge pumped by the first and the second pump cascades and providing an output supply voltage that is greater in magnitude than a power supply voltage; each pump stage having a FET configured as a diode and a FET configured as a capacitor, the FETs of a first pump stage of each pump cascade having a first oxide thickness and the FETs of a last pump stage of each pump cascade having a second oxide thickness, the second oxide thickness being greater than the first oxide thickness; each (2n)th pump stage of the first pump cascade is coupled to a first non-overlapping clock signal and each (2n)th pump stage of the first pump cascade is coupled to a non-overlapping second clock signal, n being an integer greater than or equal to zero: each (2n)th pump stage of the second pump cascade is coupled to the second non-overlapping clock signal and each (2n+1)th pump stage of the second pump cascade is coupled to the first non-overlapping clock signal, n being an integer greater than or equal to zero; and a non-overlapping clock signal generator for supplying the first and second non-overlapping clock signals, comprising a system clock input node; a clock input stage; a latch coupled to the clock input stage having intermediate latch outputs and complementary latch outputs; clock output driving stages coupled to the complementary latch outputs and having non-overlapping clock signal outputs; and an equalization stage coupled between the clock output driving stages and receiving as inputs the intermediate latch outputs.

2. The charge pump circuit of claim 1, where the FETs are PFETs.

3. The charge pump circuit of claim 1, where the first pump stage of each cascade is coupled to the power supply voltage.

4. The charge pump circuit of claim 1, where each pump cascade is coupled to the output node by a coupling diode.

5. The charge pump circuit of claim 4, where the coupling diode is a diode connected FET having a gate oxide of the second oxide thickness.

6. The charge pump of claim 1, where the first and second non-overlapping clock signals are generated from a system clock signal and the charge pump stages pump charge to the output node in response to both a rising edge and a falling edge of the system clock signal.

7. A charge pump power supply for use in a DRAM comprising a charge pump cascade having a plurality of pump stages coupled in series with each pump stage having a FET configured as a diode and a FET configured as a capacitor; the FETs of a first of the pump stages having a first oxide thickness and the FETs of a last of the pump stages having a second oxide thickness, the second oxide thickness being greater than the first oxide thickness; the first pump stage coupled to a power supply voltage; a (2n)th pump stage of the pump cascade is coupled to receive a first non-overlapping clock signal and (2n+1)th pump stage of the pump cascade is coupled to receive a second non-overlapping clock signal, n being an integer greater than or equal to zero; and a non-overlapping clock signal generator for supplying the first and second non-overlapping clock signals, comprising a system clock input node: a clock input stage; a latch coupled to the clock input stage having intermediate latch outputs and complementary latch outputs; clock output driving stages coupled to the complementary latch outputs and having non-overlapping clock signal outputs; and an equalization stage coupled between the clock output driving stages and receiving as inputs the intermediate latch outputs.

8. The charge pump circuit of claim 7, wherein the FETs are PFETs.

9. The charge pump cascade of claim 7, wherein the pump cascade is coupled to the output node by a diode connectd FET having a gate oxide of the second oxide thickness.

10. A method for providing a charge pump power supply for a DRAM comprising steps of:

coupling first and second pump cascades in parallel to an output node, each pump cascades having a plurality of pump stages coupled in series;

providing each pump stage with a FET configured as a diode and a FET configured as a capacitor, the FETs of a first pump stage of each pump cascade having a first oxide thickness and the FETs of a last pump stage of each pump cascade having a second oxide thickness, the second oxide thickness being greater than the first oxide thickness;

coupling each 2(n)th pump stage of the first pump cascade and each 2(n+1)th pump stage of the second pump cascade to a first non-overlapping clock signal and each 2(n+1)th pump stage of the first pump cascade and each 2(n)th pump stage of the second pump cascade to a second non-overlapping clock signal; and providing a non-overlapping clock signal generator for supplying the first and second non-overlapping clock signals by coupling a system clock input node to a clock input stage, coupling a latch having intermediate latch outputs and complementary latch outputs to the clock input stage: coupling an equalization stage to the intermediate latch outputs and between clock output driving stages: and coupling the clock output driving stages to the complementary latch outputs to generate the non-overlapping clock signals.

* * * * *